United States Patent [19]
Smolinski

[11] Patent Number: 6,030,730
[45] Date of Patent: Feb. 29, 2000

[54] PHOTOMASK REPAIRED FROM BLACK DOT DEFECT

[75] Inventor: Jacek Smolinski, Jericho, Vt.

[73] Assignee: International Business Machines Corporation, Armonk, N.Y.

[21] Appl. No.: 09/139,998

[22] Filed: Aug. 26, 1998

Related U.S. Application Data

[62] Division of application No. 08/940,285, Sep. 30, 1997, Pat. No. 4,271,523.

[51] Int. Cl.[7] .................................................. G03F 9/00
[52] U.S. Cl. ...................................................... 430/5
[58] Field of Search .................................. 430/5, 22, 322; 378/35; 204/192.34

[56] References Cited

U.S. PATENT DOCUMENTS

| | | |
|---|---|---|
| 4,200,668 | 4/1980 | Segal et al. . |
| 4,548,883 | 10/1985 | Wagner . |
| 4,592,975 | 6/1986 | Young et al. . |
| 4,727,234 | 2/1988 | Oprysko et al. . |
| 4,906,326 | 3/1990 | Amemiya et al. . |
| 4,933,565 | 6/1990 | Yamaguchi et al. . |
| 5,164,565 | 11/1992 | Addiego et al. . |
| 5,318,869 | 6/1994 | Hashimoto et al. . |
| 5,464,713 | 11/1995 | Yoshioka et al. . |
| 5,830,607 | 11/1998 | Isao et al. .................................. 430/5 |

*Primary Examiner*—S. Rosasco
*Attorney, Agent, or Firm*—DeLio & Peterson LLC; John J. Tomaszewski; Howard J. Walter, Jr.

[57] ABSTRACT

A method and apparatus for repairing black dot defects connected to a circuit pattern in photomasks such as a photomask having a patterned chromium film on a glass substrate comprises using an energy source in the form of an energy beam to first sever the connected black dot defect from the chrome pattern forming a space between the defect and the chrome pattern. The remaining severed black dot defect is then removed using the same or different energy beam to remove the remainder of the chrome defect. An apparatus for removing black dot defects and photomasks produced by the method and apparatus of the invention are also provided.

4 Claims, 4 Drawing Sheets

PHOTOMASK REPAIRED FROM BLACK DOT DEFECT

This is a Divisional application Ser. No. 08/940,285 now U.S. Pat. No. 4,271,523.

BACKGROUND OF THE INVENTION

1. Field of the Invention

This invention relates to a method and apparatus for repairing defects in photomasks usable in the manufacture of semiconductor microcircuits and other electronic components to transfer a circuit pattern onto a workpiece and, in particular, to removing defects which are connected to and protrude transversely from the photomask pattern. The defects are a form of a defect commonly termed black dot defects.

2. Description of Related Art

In the manufacture of circuit patterns on electronic components such as the manufacture of integrated circuits on semiconductor substrates photomasks are used to transfer the desired circuit pattern onto the substrate workpiece. Typically, a photomask comprises a patterned metal film such as chromium, nickel or aluminum in a thickness of about 1,000 Å deposited on a transparent base such as glass or quartz. The photomask is generally manufactured by depositing a thin film of the metal on the surface of the transparent substrate, coating the film metal with a photoresist coating, exposing a pattern on the photoresist coating, developing the resist coating, and removing the metal from the unprotected areas of the film by etching leaving patterned metal film on the substrate.

The pattern contained in the photomask is reproduced onto the surface of a workpiece typically by placing the mask over the workpiece and irradiating a radiation-sensitive resist material on the workpiece. The variety of radiation sources for lithography that have been used or proposed include visible light, ultraviolet light, x-ray radiation, electrons and ions. When illuminated by the radiation, the metal pattern on the photomask serves to selectively block portions of the radiation beam while allowing other portions to be transmitted therethrough. In this manner, very complex geometries having very narrow line widths can be reproduced allowing the economical production of very large scale integrated circuits and other devices.

A photomask is typically employed a large number of times for the production of numerous electronic devices. This places stringent demands on the quality of a photomask since any flaws or defects are reproduced in the workpiece which directly effects the operability of the workpiece.

The process of fabricating photomasks, however, typically causes several defects in the pattern. The defects are usually classified as opaque and clear with opaque defects arising where excess metal (chrome) exists in an unwanted area and clear defects arising where metal (chrome) is missing from a desired area. Opaque defects in a mask are commonly termed black dot defects and typical black dot defects are shown in FIG. 1. Currently it is possible to repair such black dot defects (i.e., remove excess chrome) by laser vaporization. The repair of isolated black dot defects shown as 13d in FIG. 1 and clear defects are not the subject of this application. This subject invention is directed to black dot defects which are connected to the pattern such as 13a, 13b and 13c of FIG. 1 and the following description will be directed to this type black dot defect.

Method and apparatus are commercially available for repairing black dot mask defects by focusing laser light energy on the defect to vaporize and scatter the metal film molecules. Such apparatus using microscope optics has become automated including computer control of an optical X-Y table and the laser source so that a mask can be scanned, the position of opaque defects noted and stored as compared to a proper mask pattern and the data placed in the apparatus for computer controlled positioning of the mask and operation of the laser to ablate (vaporize) the defects.

There are certain problems, however, in using a laser or other form of energy to ablate a black dot defect. For example, the ablated chrome could land on top of the adjacent chrome image being repaired and become an annealed chrome layer due to the heat of the ablated chrome. After repair, for example, the chrome thickness next to the repair can be up to twice as thick as the original chrome pattern. If an additional laser ablation is required, the annealed material would not be readily ablated due to its hardened annealed characteristics. A further problem is the pattern edge of the repair cannot be well defined because heat is transferred to the chrome line. This can make edge reconstruction of fine features difficult, particularly in tight geometries having narrow line widths of less than about 1 micron. Heat supplied to remove the black dot defect can also thermally damage the pattern line. Processes which melt or evaporate the attached black dot defect, therefore, create a thermal/mechanical situation where repair process tooling needs to be optimally set to effect a satisfactory black dot repair.

There are a variety of photomasks including, x-ray masks, which typically have an order of magnitude of density greater than optical masks and laser repairs of optical mask defects while difficult is generally easier than repairing x-ray masks. In general, the x-ray masks have a larger metal pattern thickness which results in an increased thermal effect due to the laser ablation process.

A number of patents have issued in the art of repairing defective photomasks and include U.S. Pat. Nos. 4,200,668; 4,548,883; 4,727,234 and 4,933,565. These patents discuss the various type of photomasks and the different methods employed to repair black dot defects on the mask and the disclosures of each of the above patents are hereby incorporated by reference. The following description will be directed to the repair of chrome metal masks but it will be appreciated by those skilled in the art that the invention applies to other masks such as optical masks, x-ray masks, attenuated phase shift masks and alternating phase shift masks which may be made using a variety of metals as the patterning design such as chrome, MoSi, and chrome oxide fluoride.

Bearing in mind the problems and deficiencies of the prior art, it is an object of the present invention to provide a method to repair black dot defects connected to the patterned circuitry in photomasks used to make electronic components such as semiconductors.

It is a further object of the invention to provide an apparatus to repair black dot defects connected to the patterned circuitry in photomasks used to make semiconductor electronic components.

It is another object of the invention to provide photomasks made in accordance with the method and apparatus of the invention.

Other advantages of the invention will in be readily apparent from the following description.

SUMMARY OF THE INVENTION

The above and other objects and advantages, which will be apparent to one of skill in the art, are achieved in the present invention which is directed, in a first aspect, to a method for repairing black dot defects(i.e., mask patterning material connected to the pattern material and protruding essentially transverse to the axis (design) of the pattern) in a photomask wherein the mask comprises a circuit pattern of a mask patterning material (in either a negative or positive form) on a mask substrate which mask pattern is transferred to an electronic component substrate the method comprising the steps of:

locating and identifying a pattern connected black dot defect;

separating the connected defect from the circuit pattern using an energy beam to form an opening or space between the pattern material and the black dot defect; and removing the separated black dot defect using the same or a different energy beam.

In another aspect of the invention, an apparatus is provided for removing black dot (protruding) defects connected to the circuit pattern material from photomasks used in the manufacture of electronic components such as semiconductors, the photomask having a circuit pattern thereon which pattern is transferred to the electronic component substrate comprising:

a holding device for securing a photomask having a circuit pattern thereon;

moving means for moving the secured photomask in an X-Y plane;

detecting means for locating and identifying a pattern connected black dot defect;

energy means to direct an energy beam at the surface of the photomask for removing pattern forming material from the surface of the photomask;

positioning means to position the photomask under the energy means so that the energy beam will be directed to a particular X-Y position of the photomask; and whereby when the defect is to be removed, the photomask is positioned and the energy means activated to sever (separate) the pattern connected defect from the photomask pattern by forming a space between the defect and the photomask pattern after which the photomask is positioned so that the same or a different energy beam will be directed on the remaining separated defect and ablate the severed defect.

Photomasks made by the method and using the apparatus of the invention are also provided herein.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
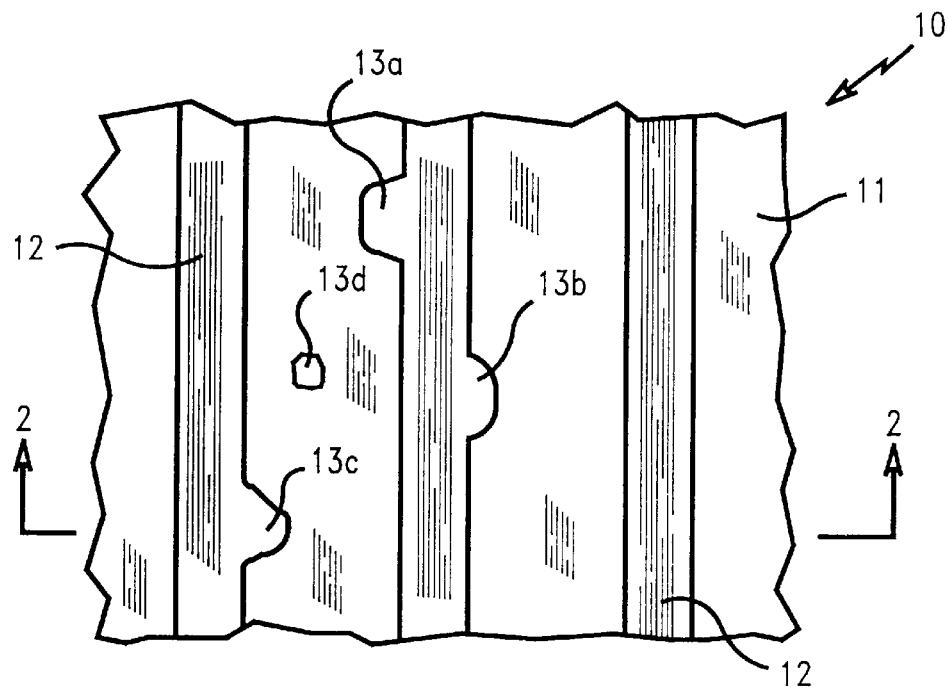
FIG. 1 shows an enlarged top plan partial view of a photomask having black dot defects thereon.

In describing the preferred embodiment of the present invention, reference will be made herein to FIGS. 1–4E of the drawings in which like numerals refer to like features of the invention. Features of the invention are not necessarily shown to scale in the drawings.

The present invention is used to remove pattern connected black dot type defects from photomasks and any type photomask may be repaired using the method and apparatus of the invention. Exemplary photomasks include chrome on quartz, attenuator on quartz, absorber metal in x-ray masks and chrome oxide fluoride. For convenience, the following description will be directed to chrome patterned quartz or glass substrate photomasks. These masks, as note above, typically comprise a metal pattern film such as chromium, nickel or aluminum in a thickness in the order of about 1,000 Å deposited on a transparent base such as glass or quartz. Also for convenience, the following description will be directed to the repair of patterns in the form of conductor lines although it will be appreciated by those skilled in the art that other type patterns (e.g. pads) may likewise be repaired using the method and apparatus of the invention.

Figure 3:
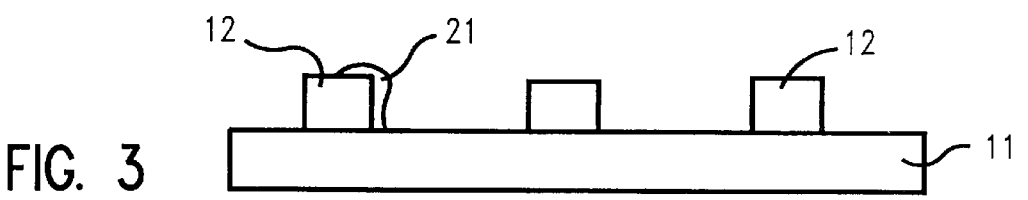
FIG. 3 is a side view of a photomask having a black dot defect which was repaired using conventional energy beam ablation techniques.

Basically, the invention comprises a method for repairing a chrome line containing a black dot defect connected thereto by severing the defect from the chrome line using an energy beam such as a laser beam, ion beam and micro machining (collectively referred herein generally as "energy beam"). To sever the black dot defect from the chrome line, the energy beam is used to form a space between the defect and the chrome line so that the defect and the chrome line are substantially severed and preferably do not contact each other along the space formed between the chrome line and severed defect. For some repairs partial severance of the defect (e.g., up to 50% of the height of the defect) may be acceptable. Once the defect is separated (severed) from the chrome line, the defect may be ablated using an energy beam. By ablation is meant that the defect material which is exemplary chrome, will be typically vaporized by the energy beam and removed from the mask. It has been found that this two step procedure of first forming a space between the connected defect and the chrome line prevents any significant defect material from redepositing during the conventional laser ablation process as shown in FIG. 3. The process also provides for enhanced chrome line definition not readily obtainable by conventional one-step laser ablation techniques.

It is hypothesized that using the two step method of the invention that there is less heat transfer to the chrome line which results in less defect metal redeposition on the chrome line being repaired. Another advantage of the invention is that reduced energy beam energy may be used to remove the defect. A reduced risk of glass or other photomask substrate damage and easier image size control is also obtained and there is generally no need for a second laser ablation to control the image size. A constant laser energy may also be employed as compared to prior art methods. Another important feature of the invention is that for methods which do not sever the defect, the energy needed to remove the defect will vary significantly with geometry and there is no practical way to predict the amount of energy needed resulting in the use of not enough energy and multiple repair attempts or the use of too much energy and line or substrate damage.

Referring now to FIG. 1, an enlarged top plan partial view of a chrome line containing photomask is shown. The photomask generally shown as 10 comprises a glass or quartz substrate 11 with chrome lines 12 on the surface thereof. The lines 12 are shown as substantially parallel and a mask such as this would be used to form circuitry on a semiconductor device having parallel circuit lines. Black dot defects 13a, 13b and 13c are shown connected to two of the three chrome lines 12. These are the defects which must be removed to provide the desired required photomask. Isolated black dot defect 13d may be removed by conventional laser ablation and is not the subject of this invention.

Figure 2A:
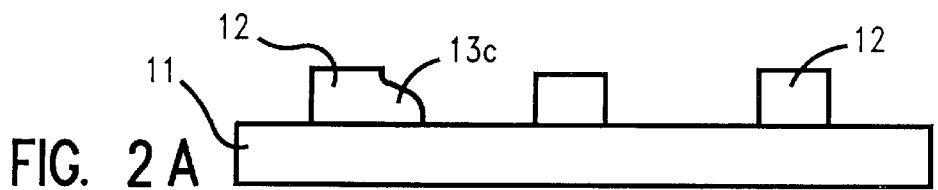
FIGS. 2A, 2B and 2C are cross-sectional side views along the lines 2—2 of FIG. 1 showing a series of steps to repair photomask pattern lines having a black dot defect.
Figure 2B:
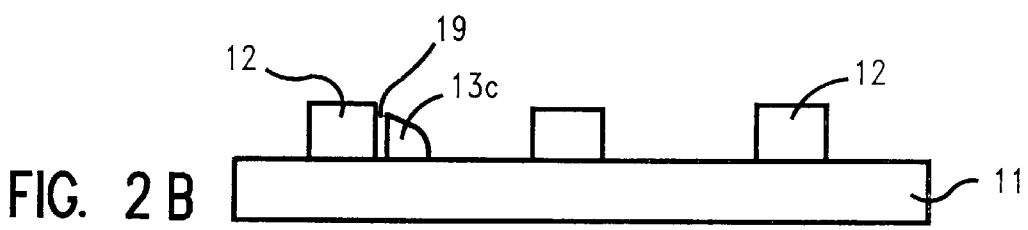
Figure 2C:
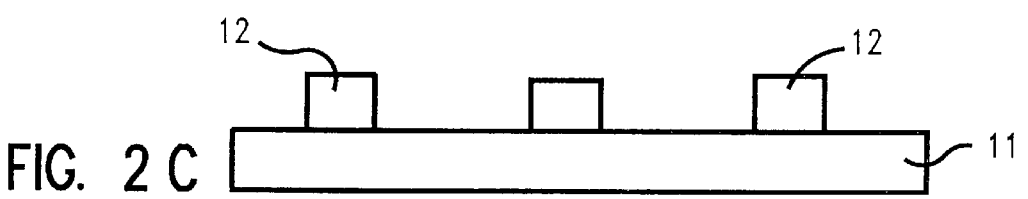

Referring to FIG. 2A, a cross-sectional side view of the photomask of FIG. 1 shown. The photomask 10 comprising glass substrate 11 and chrome lines 12 has black dot defect 13c protruding (extending transverse) to the longitudinal axis of the line from the edge of chrome line 12. FIG. 2B shows the black dot defect 13c being severed from chrome line 12 using the method of the invention to form space 19 between the chrome line 12 and defect 13c. Space 19 preferably extends from the top of the defect to the surface of the glass substrate 11. FIG. 2C shows the black dot defect 13c being completely removed from photomask 10.

Referring to FIG. 3, removal of a black dot defect 13c such as shown in FIG. 2A using conventional laser ablation techniques would typically result in a redeposition of the ablated metal as coating 21 on chrome line 12. The chrome line 12 would therefore have additional chrome material thereon and poor line definition which is not acceptable from a photomask standpoint. It is this problem which the method and apparatus of the invention overcomes.

Figure 4A:
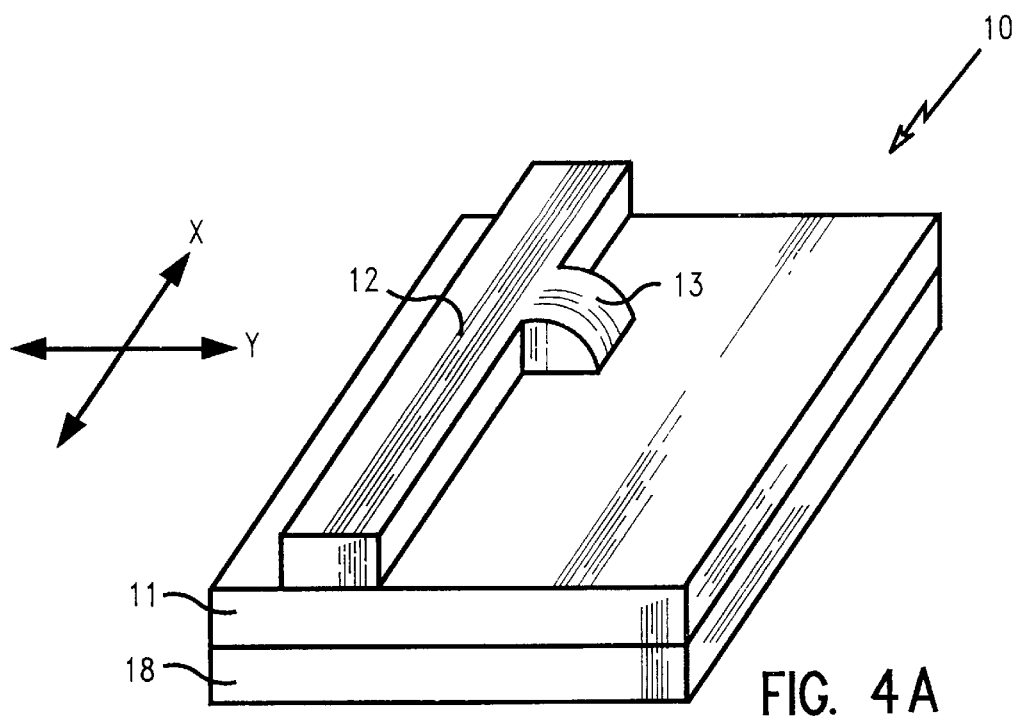
FIGS. 4A–4E are perspective views of part of a photomask having a circuit line thereon showing the method of the invention for removing a pattern connected black dot defect from the photomask.

Referring now to FIGS. 4A–4E, in FIG. 4A a photomask 10 is shown secured to an X-Y table 18. X-Y tables are well-known in the art and are used to move a secured substrate in an X-Y plane at a controlled rate and distance over a desired repair area usually by computer control. The mask once secured to the X-Y table is caused to move in an X-Y direction as shown by the arrows. The photomask 10 comprises a glass substrate 11, a chrome line 12 and a connected black dot defect 13 extending transversely from the edge of chrome line 12.

Figure 4B:
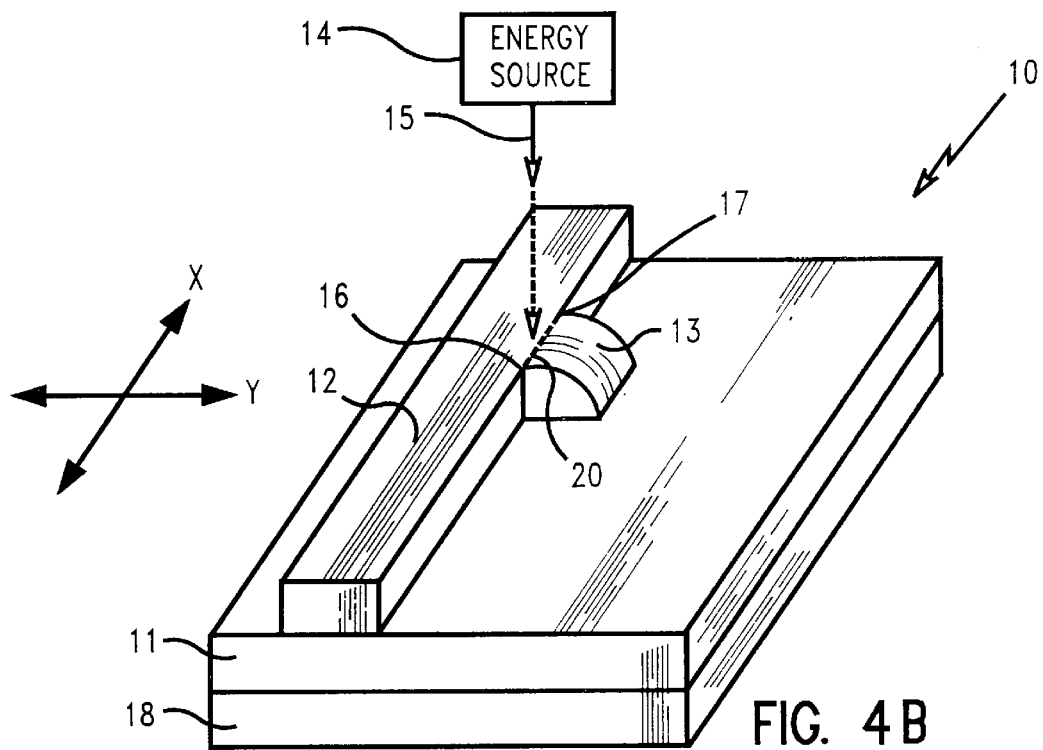

In FIG. 4B, an energy beam source 14 is directed and positioned above the photomask 10 and X-Y table 18 assembly. The X-Y table is positioned so that an energy beam source 14 and formed energy beam 15 are directed to point 16 at the intersection of the edge of chrome line 12 and the black dot defect 13. The energy beam source is activated and the energy beam 15 directed at the photomask. The energy beam will ablate (remove) a portion of the black dot defect 13 depending on the size of the beam and depending on the parameters and conditions used for the ablation procedure. The X-Y table 18 during the severance step of the process is moved along the X direction from point 16 towards point 17 of chrome line 12. During movement of the X-Y table over the X direction from point 16 along line 20 to point 17, the chrome black dot defect material is removed along the line forming a space between the chrome line 12 and the remainder of the black dot defect 13.

Figure 4C:
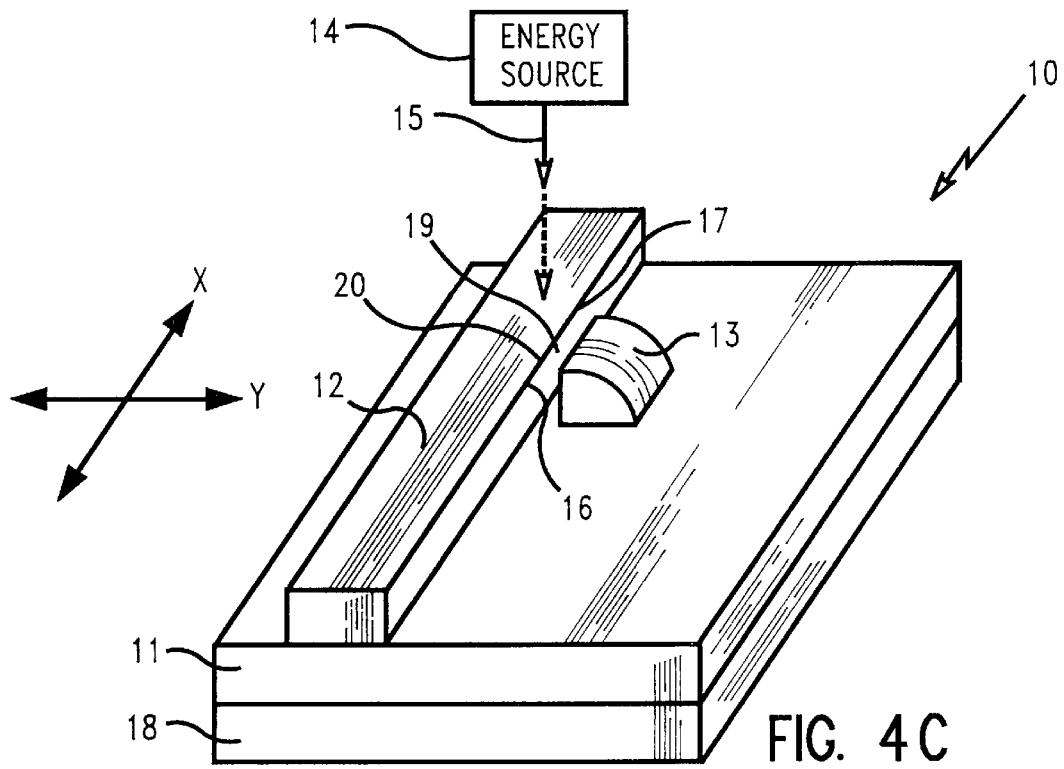

Referring now to FIG. 4C, the result of the severance procedure of FIG. 4B is shown whereby the energy beam source 14 and energy beam 15 are now positioned at point 17 of photomask 10. A space 19 has been formed between chrome line 12 and the remainder of black dot defect 13.

Figure 4D:
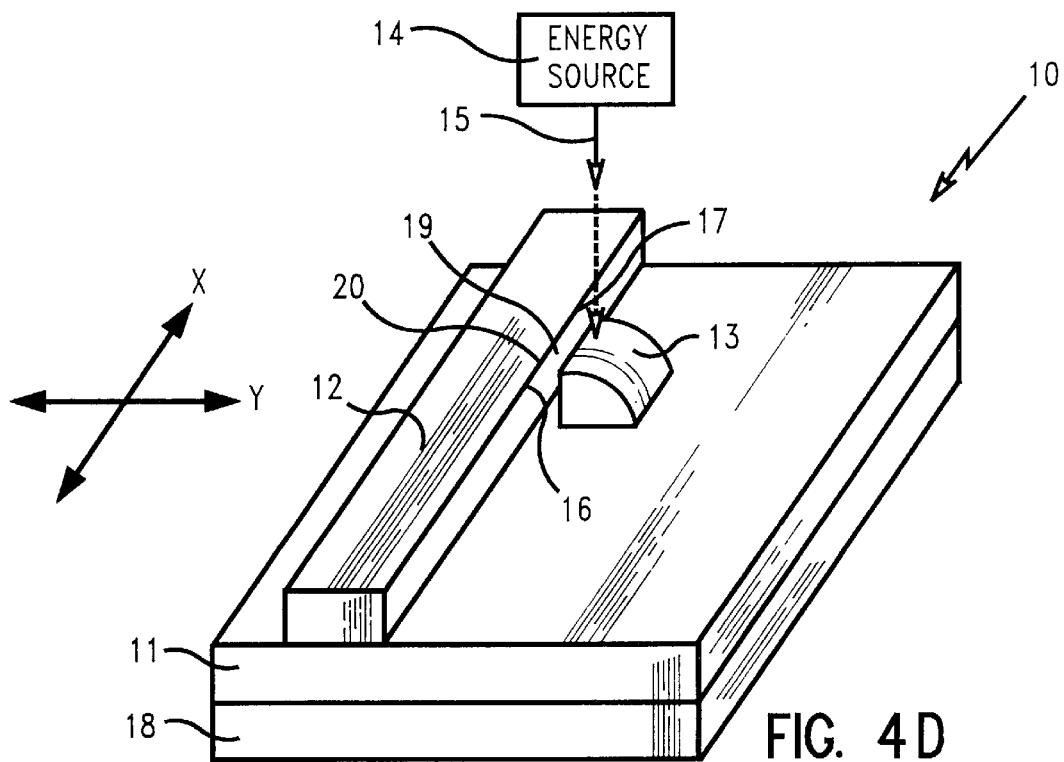
Figure 4E:
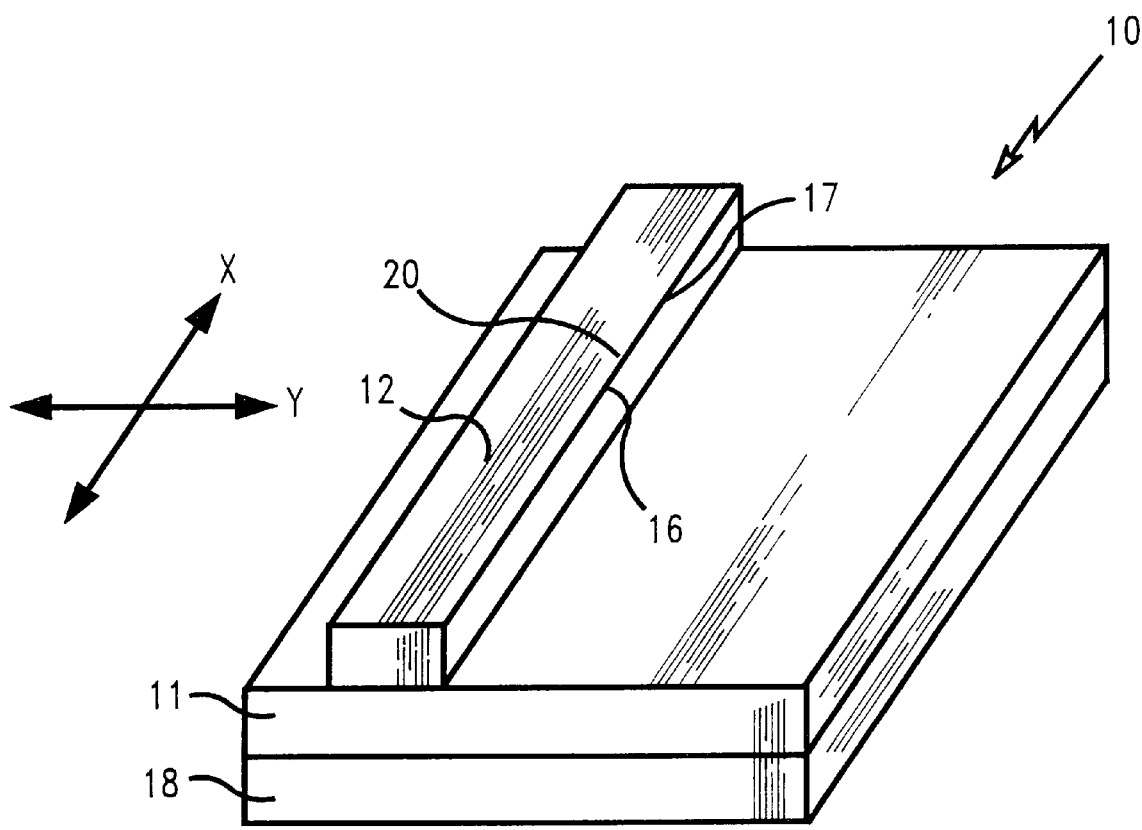

In FIG. 4D, the energy beam source 14 and energy beam 15 are positioned and directed at the remainder of black dot defect 13 and the X-Y table 18 caused to move in a desired X-Y direction over the defect area to ablate the remainder of black dot defect 13. The repaired photomask is shown in FIG. 4E.

While the beam used to form space 19 and to ablate the remainder (severed) defect is shown to be the same, the beam to form space 19 is preferably different from the beam used to ablate (remove) the severed defect 13. Also, both beams may or may not be provided by the same beam energy source device 14. In one embodiment, the defect of the mask is severed using a focused ion beam and after the defect has been severed from the pattern, the mask is moved and positioned at the same mask location under another energy source preferably a pulsed laser beam.

Any suitable beam may be used for either cutting (severing) the defect or ablating the severed defect. A laser beam, ion beam (preferably a focused ion beam) and micro machining are exemplary. The beam width for either severing or ablation can be controlled at any desired width and may be as narrow as 0.1 micron with a focused ion beam. The beam intensity may also vary widely and is essentially determined by the pattern material.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A repaired photomask repaired by the method comprising:

forming a circuit pattern in the form of metal films on a transparent substrate forming a photomask;

locating and identifying a black dot defect connected to a portion of the circuit pattern;

separating the defect from the circuit pattern using an energy beam to form a space between the circuit pattern and the black dot defect; and removing the separated black dot defect and repairing the circuit pattern on the photomask using the same or a different energy beam so that the portion of the circuit pattern which was repaired is substantially the same dimension as the unrepaired circuit pattern without any significant annealing of the repaired portion of the circuit pattern.

2. The photomask of claim 1 wherein the metal is chrome and the substrate is quartz or glass.

3. The photomask of claim 1 wherein the energy being used to form the space is a laser or ion beam.

4. The photomask of claim 3 wherein the energy being used to ablate the remainder of the separated defects with a pulsed laser beam.

* * * * *